United States Patent [19]
Yen

[11] Patent Number: 4,818,723
[45] Date of Patent: Apr. 4, 1989

[54] SILICIDE CONTACT PLUG FORMATION TECHNIQUE

[75] Inventor: Yung-Chau Yen, San Jose, Calif.

[73] Assignee: Advanced Micro Devices, Inc., Sunnyvale, Calif.

[21] Appl. No.: 119,260

[22] Filed: Nov. 4, 1987

Related U.S. Application Data

[63] Continuation of Ser. No. 802,570, Nov. 27, 1985, abandoned.

[51] Int. Cl.[4] .......................................... H01L 21/283
[52] U.S. Cl. ....................................... 437/200; 437/192;
  437/246; 437/228; 148/DIG. 19; 357/71
[58] Field of Search ............... 437/192, 193, 200, 187,
  437/246, 228; 148/DIG. 19; 357/67, 71

[56] References Cited

U.S. PATENT DOCUMENTS

| | | | |
|---|---|---|---|
| 3,753,774 | 8/1973 | Veloric | 437/193 |
| 3,777,364 | 12/1973 | Schinella et al. | 437/178 |
| 4,392,298 | 7/1983 | Barker et al. | 29/577 C |
| 4,448,636 | 5/1984 | Baber | 156/643 |
| 4,481,070 | 11/1984 | Thomas et al. | 156/643 |
| 4,532,702 | 8/1985 | Gigante et al. | 29/578 |
| 4,538,344 | 9/1985 | Okumura et al. | 29/589 |
| 4,545,852 | 10/1985 | Barton | 156/643 |
| 4,562,640 | 1/1986 | Widmann et al. | 29/591 |
| 4,592,802 | 6/1986 | Deleonibus et al. | 156/644 |

FOREIGN PATENT DOCUMENTS

| | | | |
|---|---|---|---|
| 0068897 | 1/1983 | European Pat. Off. | 437/200 |
| 0004924 | 1/1983 | Japan | 437/178 |
| 0117719 | 6/1985 | Japan | 437/192 |

OTHER PUBLICATIONS

Kircher et al, "Interconnection Method for ICs", *IBM Tech. Disc. Bull.*, vol. 1, No. 2, Jul. 1970, p. 436.
Rideout, "Reducing the Sheet Resistance of Polysilicon Lines in ICs", *IBM Tech. Disc. Bull.*, vol. 17, No. 6, Nov. 1974, pp. 1831–1833.
Murata et al, "Refractory Silicides of Ti and Ta ... ", *IEEE J of Solid State Circuits*, vol. SC 15, No. 4, Aug. 1980, pp. 474–482.

*Primary Examiner*—Brian E. Hearn
*Assistant Examiner*—T. N. Quach
*Attorney, Agent, or Firm*—Fliesler, Dubb, Meyer & Lovejoy

[57] ABSTRACT

An integrated circuit fabrication process for improving step coverage of the metal lines and of metal layer interconnections is disclosed. A conductive polysilicon, polycide, or polycide-on-polysilicon plug is formed in contact apertures by successive silicidation sequences of silicon/refractory metal deposition and heat treatment. A preceding silicide may also be removed prior to a succeeding silicidation to reduce silicon lining.

8 Claims, 6 Drawing Sheets

SILICIDE CONTACT PLUG FORMATION TECHNIQUE

This application is a continuation of application Ser. No. 802,570, filed 11/27/85 abandoned.

BACKGROUND OF THE INVENTION

1. Field of the Invention

The present invention generally relates to integrated circuit fabrication processes and, in particular, to a method for improving step coverage in very large scale integration (VLSI) semiconductor die fabrication.

2. Description of the Related Art

VLSI technology research and development in integrated circuit fabrication has resulted in semiconductor chips in which the geometry of individual components is continuously scaled down in order to improve performance and to conserve chip area for better manufacturing yield. One of the inherent problems in the microscopic dimensioning of the die is that interconnection of the individual components requires the filling of one or more contact apertures per component in layers formed over each individual active component. These apertures, also known as "contact windows" and "vias," typically lead down through the insulator to the contact area of each active device which is to be electrically coupled. That is to say, although to the naked eye a semiconductor die appears to be flat, it is, in fact, a nonplanar environment.

Currently, down-scaling is carried out horizontally; the vertical dimension is not scaled proportionally. This causes a very severe problem in fabrication processes, commonly referred to as "step coverage." In VLSI, the horizontal dimension for component surface areas is currently approaching the 1 micron range, with submicron dimensioning being considered as the breakthrough target. However, the vertical height, or depth, of vias may not be amenable to this scaling due to detrimental phenomena such as parasitic capacitance effects.

The standard electrical interconnection mechanism in the current state of the art is basically a patterned thin film of metal. The process procedures for forming the interconnections is commonly referred to as "metallization." In particular, a commonly used method of metallization is to sputter a metal layer onto an insulating layer, such as silicon dioxide ("oxide") which has been deposited on the whole chip area and has etched vias leading down to the substrate diffusion regions, polysilicon lines, and underlying metal lines for the completion of the desired interconnection between various components.

As depicted in FIG. 1, the relatively deep contact apertures in a VLSI die are not suited to sputtered metal films which provide adequate step coverage. The result is the occurrence of poor step coverage. Poor step coverage results in both poor reliability and many inoperative devices being formed on a wafer, i.e., low manufacturing yield.

If the metallization is an interstructural layer, the step coverage problem becomes compounded in subsequently deposited layers, unless planarization is performed on the metal layer.

One method of overcoming poor step coverage is to attempt to planarize the metallization layer after it has been formed. This method is a relatively high temperature process. High temperatures can have detrimental effects upon the semiconductor layers in which the active components have been formed. One such effect is the lateral and vertical spreading of doped regions. In a bipolar transistor, for example, an extrinsic base region may spread through an intrinsic base region and into the emitter region, or junction depths may spread down toward a buried collector region, resulting in lower breakdown voltages. In both metal-oxidesemiconductor (MOS) and bipolar devices, migration of impurities can occur during the heating cycle.

Another method is to create a relatively high phosphorus (P) concentration in the oxide layer and use high temperature after the contact etch to smooth the corners of the contact holes. Again, a disadvantage is the undesirable high temperature cycle after the formation of the source/drain of MOS transistors. The overall structure retains relatively poor surface contours for subsequent metallization processes. To overcome the high temperature requirement for P-doped oxide, the oxide can be doped with both boron (B) and phosphorus (P). However, this introduces a difficulty of the process control of the compositions of the oxide film.

Yet another method is to employ an etch technique which will result in tapered vias. This method, however, requires very delicate masking operations. Reproducibility in such a technique is difficult to achieve.

A further method has been developed to improve the step coverage by employing a gas phase reaction at low pressure, i.e., a low pressure chemical vapor deposition (LPCVD) process. However, LPCVD metal suffers from high resistivity and lack of film thickness uniformity.

Another method of improving step coverage is a doped, polysilicon plug and etch-back planarization technique taught in U.S. patent application No. 761,206 (Sander), filed July 31, 1985, and assigned to the common assignee of the present application.

In general, poor step coverage forces the semiconductor chip manufacturer to use techniques which are contrary to VLSI. Examples include: the formation of vias with inwardly sloping sidewalls, viz., retaining relatively wide window mouths; constraining spacing reduction so that high accuracy alignment of the bias is ensured, such as for complementary MOS (CMOS) devices where a p-type region may be located in an n-type well and the contact must be made only to the p-type region.

A related problem, "spiking," can occur in VLSI devices because of shallow junction depths of doped regions in the semiconductor substrate. When contacted directly by metal, such as aluminum, atoms of the metal can migrate down through the junction into a lower layer of the component structure. This also results in losses in yield and reliability.

Hence, there is a need for an integrated circuit fabrication technique for improving step coverage having better scalability while providing good ohmic contacts.

SUMMARY OF THE INVENTION

It is an object of the present invention to provide step coverage improvement for VLSI integrated circuits.

It is another object of the present invention to improve reliability, performance and manufacturing yield of integrated circuits.

It is a further object of the present invention to provide a relatively low temperature integrated circuit fabrication process for forming conductive via plugs such that thermal effects on prefabricated regions of the die are minimized.

It is still a further object of the present invention to provide a better surface contour for subsequent metallization processes which ease the masking operation for the metal patterning process.

In its bsaic aspects, the present invention provides a method for improving step coverage for integrated circuit metallization process steps by forming conductive plugs in contact apertures overlaying active component regions in a semiconductor integrated circuit die. A layer of semiconductor material, such as polysilicon for a silicon-based chip, is formed to substantially fill the contact apertures. In a preferred embodiment, the filler is doped to enhance conductivity. A layer of refractory metal is formed on the polysilicon. The polysilicon and refractory metal are reacted, such as by an annealing, whereby a polycide material is created which extends substantially into the aperture. The resultant structure is then stripped to a predetermined extent, leaving conductive polycide plugs in the apertures. Subsequent metal interconnect layers will thereby provide better step coverage. Various embodiments are disclosed by which a conductive polysilicon or polycide plug is formed.

It is an advantage of the present invention that the process can be used for a wide variety of sizes of contact windows while providing substantially uniform aperture plugs.

It is another advantage of the present invention that fabrication planarization steps for various layers can be omitted.

It is yet a further advantage of the present invention that the process steps involve relatively low temperatures, thereby minimizing detrimental effects on previously formed components in the die.

Still a further advantage of the present invention is that endpoint detection for etching is more accurate since the polycide etch rate has selectivity over polysilicon or oxide.

Other objects, features and advantages of the present invention will become apparent upon consideration of the following detailed description and the accompanying drawings, in which like reference designations represent like features throughout the Figures.

BRIEF DESCRIPTION OF THE DRAWINGS

FIGS. 2 through 6 are cross-sectional schematic drawings of idealized sequences of process steps according to various embodiments of the present invention in which:

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now in detail to a specific embodiment of the present invention, which illustrates the best mode presently contemplated by the inventor for practicing the invention. Alternative embodiments are also briefly described.

It should be recognized that many publications describe the details of common techniques used in the fabrication process of integrated circuit components. See, e.g., *Semiconductor & Integrated Circuit Fabrication Techniques*, Reston Publishing Co., Inc., copyright 1979 by the Fairchild Corporation. Those techniques generally can be employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in this art may call for appropriate adjustments as would be obvious to one skilled in the art.

Figure 1:
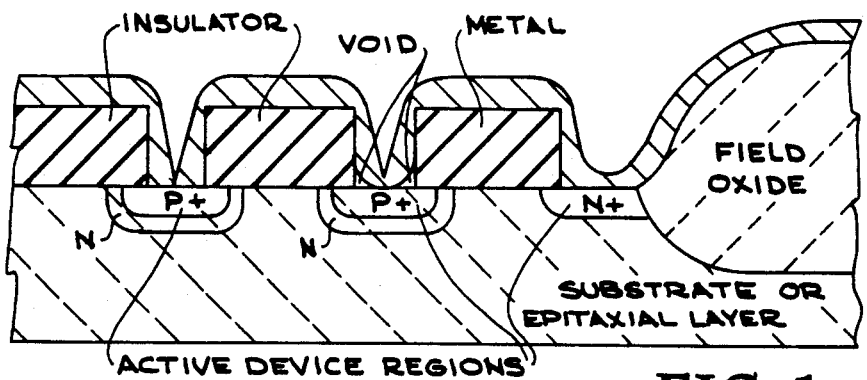
FIG. 1 is a schematic cross-sectional depiction of problems of step coverage by integrated circuit metallization layers.
Figure 2A:
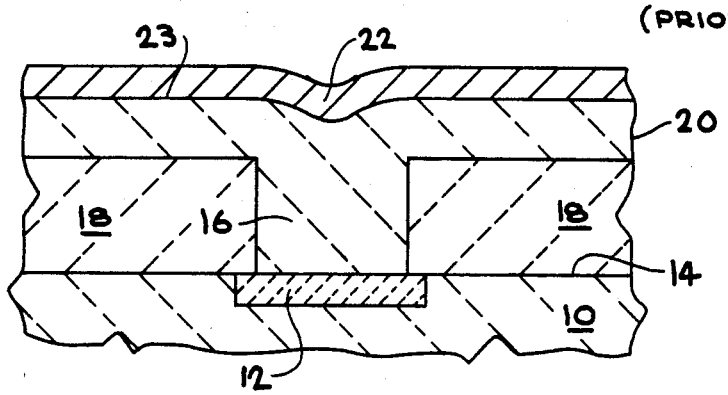
FIG. 2a shows step completion of a substrate having a contact via through a superposing layer, such as a dielectric or insulator material, onto which an amorphous semiconductor material, such as polysilicon, and an overlaying refractory metal layer, such as a titanium layer, have been sequentially formed.

FIG. 2a shows a wafer substrate 10, for example, a commercially available, lightly doped silicon wafer section. For the purpose of explaining the present invention, it is to be assumed that the wafer substrate 10 has been processed to the stage where one or more integrated circuit chips, having many active component regions and contact areas, have been constructed and are ready for metallization to form electrical interconnections in accordance with the circuit design.

One such component region 12 lies at the surface 14 of the substrate 10. For example, the substrate 10 may be a single crystal silicon substrate, or an epitaxial layer which has been grown on such a substrate, lightly doped to have a p-type conductivity. The component region 12 could be a silicon region which has been heavily doped to have an n+ conductivity to act, for example, as a bipolar transistor collector or a field effect transistor drain region. Whatever the functional nature of the contact region 12, a contact via 16 has been formed in a dielectric or insulator layer 18, such as silicon dioxide ("oxide"), overlaying the substrate 10 in order that an electrical interconnection can be made to the contact region 12. Via 16 may also open, for example, onto an interconnection line or a gated substructure of the chip.

A layer of semiconductor material, such as polysilicon 20, is formed. The semiconductor material may be selected from those semiconductor materials which form metal-semiconductor compound materials when reacted with refractory metals. The via 16 width is assumed to be relatively narrow, but easily filled using known techniques. Conventional deposition techniques, such as chemical vapor deposition (CVD) or plasma-enhanced CVD, can be employed to form the polysilicon layer 20. This layer can be doped to have a relatively low resistivity, such as by $PH_3$ in the CVD cycle or subsequent diffusion of $POCl_3$. Alternatively, the polysilicon layer 20 can be doped by known ion implantation techniques, using acceptor or donor atoms depending on the conductivity type of the contact region 12. An overall thickness of the deposited polysilicon is selected such that the polysilicon 20 forms a nearly planar surface 23, despite the conformal nature of the formation cycle.

A refractory metal layer 22 is formed upon the polysilicon 20. Exemplary suitable refractory metals are titanium (T), tungsten (W), molybdenum (Mo), tantalum (Ta), and platinum (Pt). Sputter deposition is a common process technique.

Figure 2B:
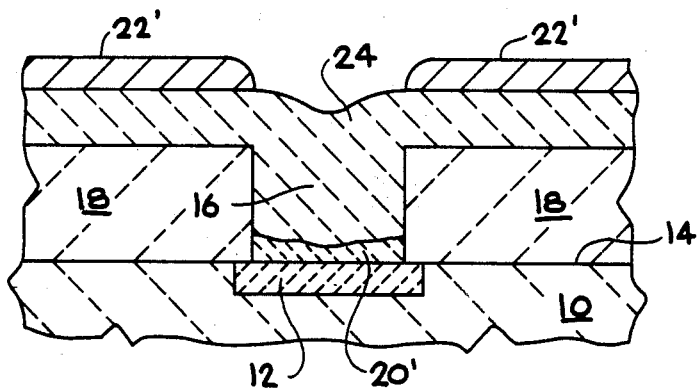
FIG. 2b shows step completion after the polysilicon and metal, as shown in FIG. 2a, have been reacted to create a polycide material.

Next, the stratified structure of polysilicon 20 and refractory metal 22 which has been formed is put through a heat treatment cycle to cause the polysilicon 20 and metal 22 to react to form a polycide material (or metal-semiconductor compound material) 24 (FIG. 2b). Typical cycle parameters are heating in a furnace tube for approximately 30 minutes to an hour at 600°–900° C. in nitrogen or argon ambient atmosphere. A high temperature, short-duration thermal anneal process may also be employed.

The relative thicknesses of the polysilicon 20 and refractory metal 22 are dependent upon the reactive properties of the materials chosen and the dimensions of the vias in which conductive plugs are to be formed. For example, it is known that a one Angstrom thick layer of titanium will react with approximately 2.27 Angstroms of polysilicon to form a polycide, titanium silicide, layer of approximately 2.51 Angstroms. To form a polycide plug, it is desirable to choose a thickness by which all, or nearly all, of the polysilicon 20 in the via 16 is reacted to form polycide 24, as shown in FIG. 2b.

FIG. 2b depicts the structure following the heat treatment cycle of the process wherein, depending upon the relative thickness of the polysilicon 20 and refractory metal 22, a residue layer of unreacted polysilicon 20' may remain in the via 16 on the surface 14 of the substrate 10. Since the polysilicon 20' is doped and since the residue can be made very thin, resistance will be low. Therefore, an ohmic contact between the contact region 12 and the polycide 24 is ensured.

If region 12 is a shallow junction region, it may be desirable to calculate the relative thicknesses and thermal cycle parameters to intentionally leave this polysilicon 20' residue to prevent encroachment or "spiking" of the polycide through the junction of contact region 12 with the substrate 10. For a deeper junction region or a metal interconnection layer contact via, the reaction can be performed to convert the polysilicon to polycide completely.

An important aspect of the present invention is the control afforded by the nature of the reaction. The thickness of the refractory metal 22 can be determined by the known thickness of the polysilicon 20 and the known depth of the via 16. Hence, the metal 22 thickness can be predetermined such that a polysilicon, polycide on polysilicon, or polycide plug will remain in the via 16 depending upon the nature of the chip structure being fabricated. Later described embodiments also demonstrate this feature.

Unreacted metal residue layers 22' may also survive the heat treatment cycle. Therefore, any unreacted pure refractory metal layers 22' are removed using conventional cleaning process steps.

Figure 2C:
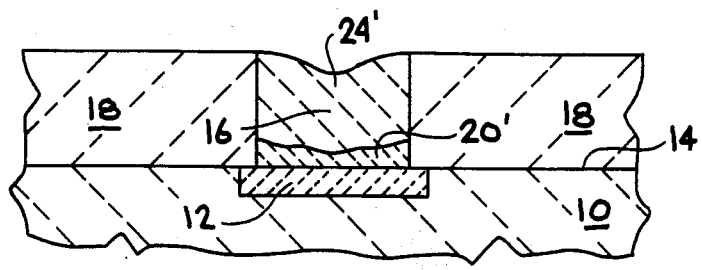
FIG. 2c shows step completion after the polycide and any residual metal, as shown in FIG. 2b, have been stripped to leave a polycide plug which substantially fills the contact via.

Thereafter, the polycide 24 is partially etched such that it is removed from the oxide 18 but remains in the via 16. The etch can be performed using conventional chemical etchants, such as buffered hydrofluoric acid, or a chlorine plasma etchant. Thus, as shown in FIG. 2c, a conductive polycide plug substantially fills the via. The overall structure has been made substantially planar. A subsequently formed metallization layer, such as typically deposited by masking and sputtering aluminum or forming a metal silicide interconnection structure (e.g., see U.S. patent application Ser. No. 430,188, Wollesen et al., filed 9/30/82 now abandoned and commonly assigned to the assignee of the present application), will also be substantially planar.

A metal layer deposition, therefore, will provide better step coverage. Moreover, such a metal layer will automatically have a substantially planar configuration. This is extremely important, of course, if further layers are to be constructed superposing the metal layer.

The polycide plug 24' provides an additional advantage over a simple polysilicon plug in that it will have a much lower resistivity. For example, a titanium silicide plug formed in accordance with the present invention will have a resistance of about three orders of magnitude lower than a polysilicon plug.

EXAMPLE

In a via having dimensions of $1 \times 1 \times 1$ micron (length by width by depth), a polysilicon layer filling the via and rising 10,000 Angstroms over the oxide was formed. Titanium was sputtered onto the polysilicon to have a thickness of 0.85 micron. The structure was heated to 900° C. in an $N_2$ ambient for 30 minutes. Residual pure titanium was removed by $NH_4OH$ mixed with $H_2O_2$. The polycide was chemically etched with 10:1 BOE. This left a polycide plug of $TiSi_2$ substantially filling the via.

Figure 3A:
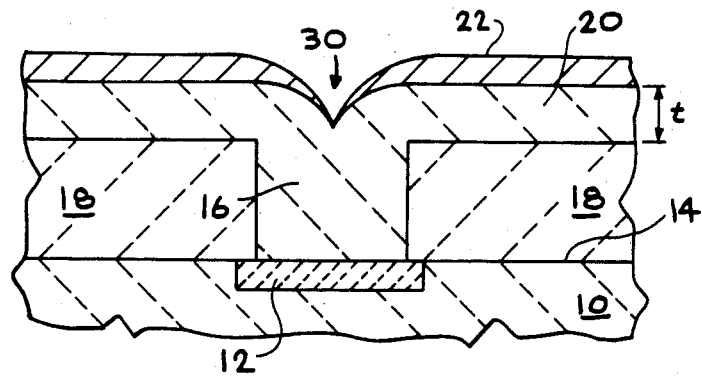
FIG. 3a shows step completion of a substrate having a contact via through a superposing layer, such as an oxide layer, onto which a polysilicon layer and refractory metal layer have been sequentially formed.
Figure 3B:
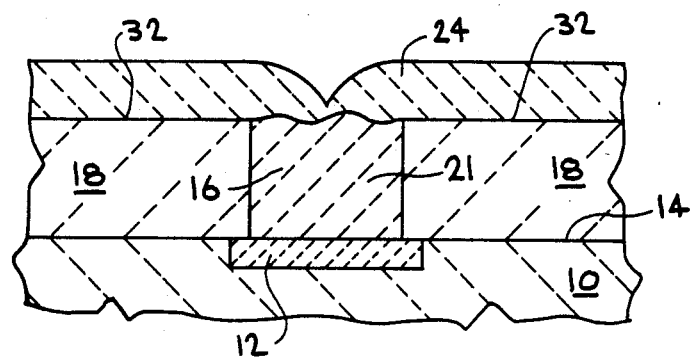
FIG. 3b shows step completion after the polysilicon and refractory metal, as shown in FIG. 3a, have been reacted to create a polycide material.

As shown in FIG. 3a, for a relatively narrow via 16, the deposits of the polysilicon 20 and refractory metal 22 may result in a cusped formation 30 above the approximate center of the via 16. In the cusp, the refractory metal thickness can vary between 10 to 50 percent of the full sputter thickness. A first alternative set of process steps for dealing with this situation is shown in FIGS. 3b and 3d. In the prior described technique, the thickness of the needed refractory metal 22 to be reacted was determined in accordance with the via depth to be filled. In this alternative, the metal 22 thickness is determined by the thickness of the polysilicon 20 deposited upon the oxide 18. For some fabrication applications, the latter may be easier to determine. However, extra process steps are required. Heavily doped LPCVD polysilicon 20 is deposited to a thickness, t, of about one-half the width of the via 16.

As demonstrated by FIG. 3b, the heat treatment cycle proceeds until polycide 24 has been formed to the major surface 32 of the oxide 18. Because of the varying refractory metal 22 thickness, the interface between the polycide 24 and the unreacted polysilicon 21 becomes substantially flat in the plane of surface 32 of the insulating layer 18. The polycide 24 is then stripped, as already described.

It is again notable that, at this stage, a polysilicon plug 21 which essentially planarizes the major surface 32 of the structure has been formed. If the relatively higher resistivity of doped polysilicon over polycide is not critical to the performance of the integrated circuit, metallization process steps can be performed immediately.

Figure 3C:
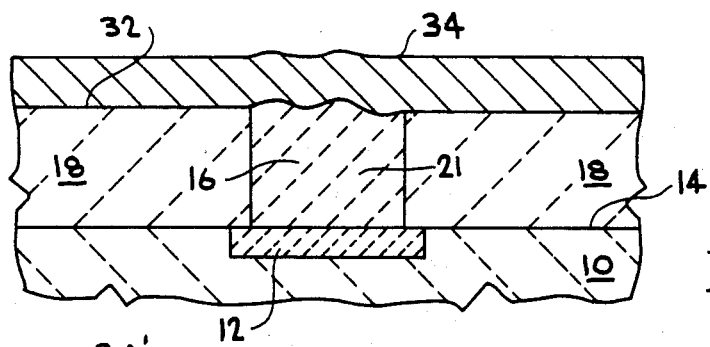
FIG. 3c shows step completion after the polycide layer, as shown in FIG. 3b, has been stripped to leave a polysilicon plug, and a second refractory metal layer has been formed.
Figure 3D:
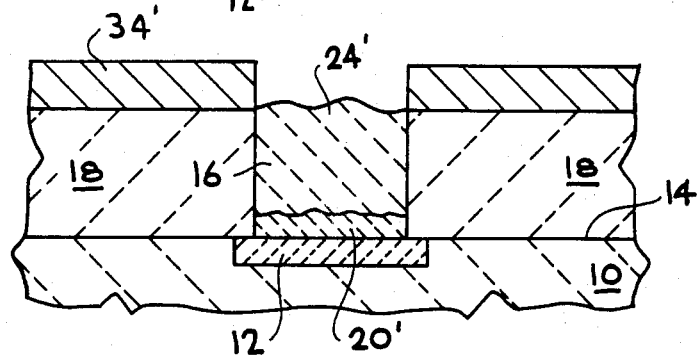
FIG. 3d shows step completion after the polysilicon plug and refractory metal of FIG. 3c have been reacted to form a polycide plug substantially filling the contact via.

Referring now to FIG. 3c, another refractory metal layer 34 is formed on the surface 32 of the structure. The thickness of layer 34 is determined by the depth of the via 16. Again, a heat treatment cycle is performed to cause the metal 34 to react with the polysilicon plug 21 in via 16. After the reaction, as depicted in FIG. 3d, the plug 21 has been substantially converted to polycide 24'.

The residue 34' of refractory metal can then be stripped or used in forming component interconnections.

Again, as discussed above, a thin layer of polysilicon 20' has been shown as left intact between the plug 21 and the contact region 12.

Another alternative embodiment is shown in FIGS. 4a through 4d. This embodiment pertains to contact windows which are not only relatively deep, but also are relatively wide. As a result of the width and the conformal nature of the deposition of a semiconductor material for example, polysilicon, the initial layer 20 into via 16 may include a major depression as indicated by arrow 40. The subsequently formed refractory metal 22 will follow the same general contour. After a first heat treatment cycle, a first polycide 24 conformal layer is formed and a polysilicon via lining 20' remains. A second semiconductor layer for example, polysilicon layer 42, is formed to at least substantially fill the depression 40. This is most easily accomplished by forming a blanket layer, as demonstrated by the dotted line in FIG. 4b. Alternatively, photoresist may be used to fill depression 40.

Then etching is performed. A polysilicon plug 42' is left in the depression 40. This plug 42' can be conductive as described above. Hence, since the structure can be relatively planar by etching to the level of surface 32, metallization can proceed at this state, or the plug 42' can be converted to polycide.

Figure 4A:
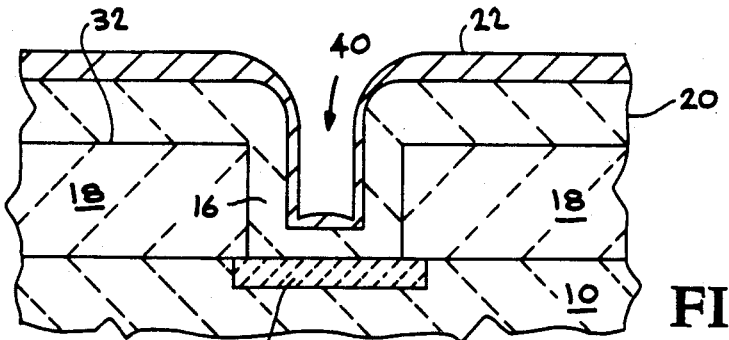
FIG. 4a shows step completion of a substrate having a contact via through a superposing layer onto which polysilicon and overlaying refractory metal layers have been sequentially formed.
Figure 4B:
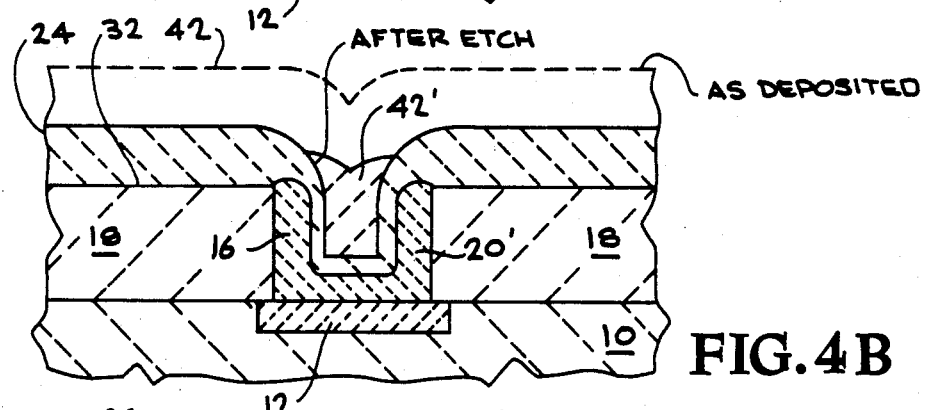
FIG. 4b shows step completion after the polysilicon and metal, as shown in FIG. 4a, have been reacted to form a polycide layer, and a superposing polysilicon layer has been formed.
Figure 4C:
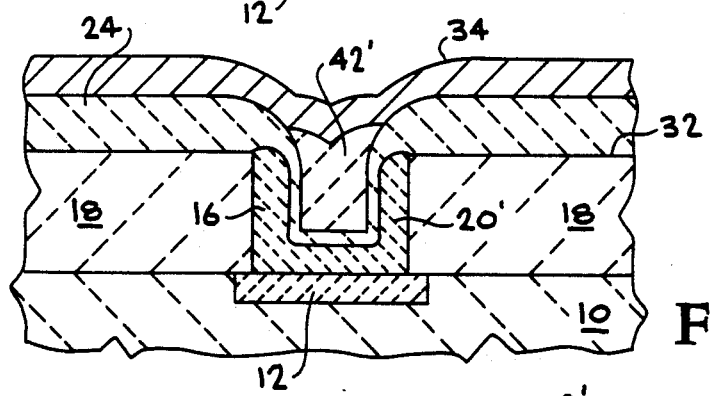
FIG. 4c shows step completion after the superposing polysilicon layer as shown in FIG. 4b has been etched and a second refractory metal layer has been formed.

Referring now to FIG. 4c, a second layer of refractory metal 34 is formed on the structure. A second heat treatment cycle is then performed.

Figure 4D:
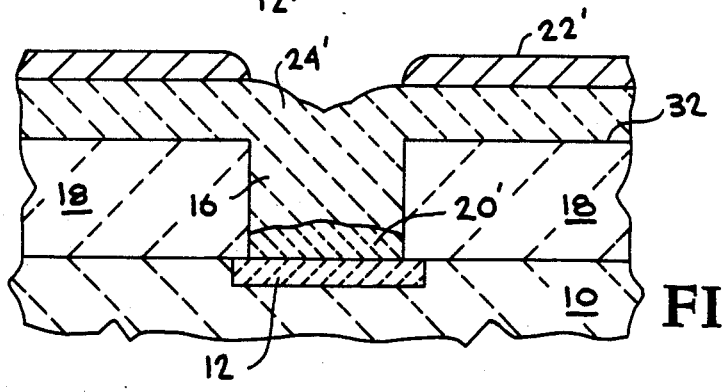
FIG. 4d shows step completion after the second refractory metal, as shown in FIG. 4c, has been reacted with the underlaying layers.

As shown in FIG. 4d following the heat treatment, a polycide 24' is formed and substantially fills the via 16. Conventional etching can then be performed to remove refractory metal residue 22' and unwanted polycide portions of layer 24' from the surface 32 of the structure.

A similar solution to the problem of a via 16 which is relatively deep and relatively narrow is shown in FIGS. 5a through 5d. The initial process steps are essentially identical in FIGS. 4a and 5a and 4b and 5b, respectively, except that an excess thickness of refractory metal 22 is formed so that no polysilicon lining 20' remains after the first heat treatment cycle. Typically, the thickness of the refractory metal 22 will be from 20-50 percent of the full thickness of the sputtered layer, depending upon the width of the depression 40. A residue 22' of refractory metal may remain which is stripped from the structure.

Figure 5A:
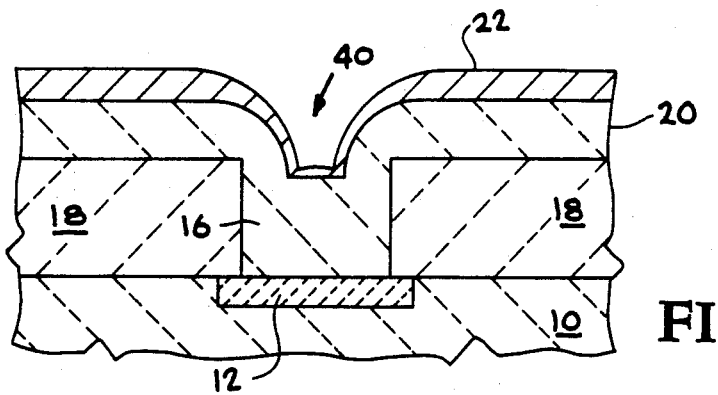
FIG. 5a shows step completion of a substrate having a superposing layer through which a contact via has been formed and onto which polysilicon and overlaying refractory metal layers have been sequentially formed.
Figure 5B:
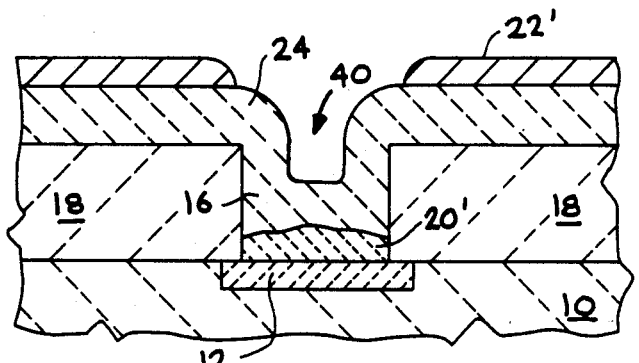
FIG. 5b shows step completion after the polysilicon and metal, as shown in FIGS. 5a, have been reacted to form a polycide layer, leaving a residue of metal.
Figure 5C:
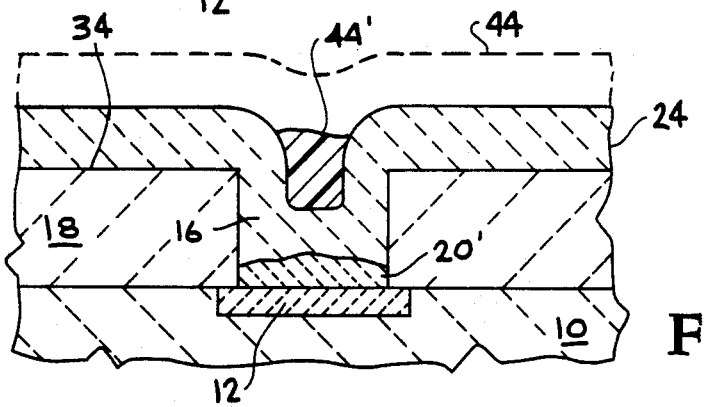
FIG. 5c shows step completion after the residue layer of FIG. 5b has been removed and a photoresist layer has been formed on the polycide layer.
Figure 5D:
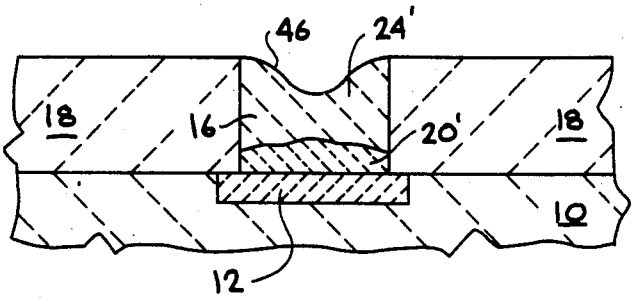
FIG. 5d shows step completion after the photoresist and polycide layers, as shown in FIG. 5c, have been etched to leave a polycide plug substantially filling the contact via.

Following this stripping, a photoresist layer 44, as indicated by the dotted line in FIG. 5c, is formed on the structure. Following the developing, only a photoresist plug 44' remains in the depression 40. The photoresist plug 44' acts as a shield for the subjacent polycide during the subsequent etching of the polycide layer. As shown in FIG. 5d, this results in a polycide plug 24' in via 16 which has a relatively smoothly curved upper surface 46. Hence, a subsequently formed metallization layer provides better step coverage.

Figure 6A:
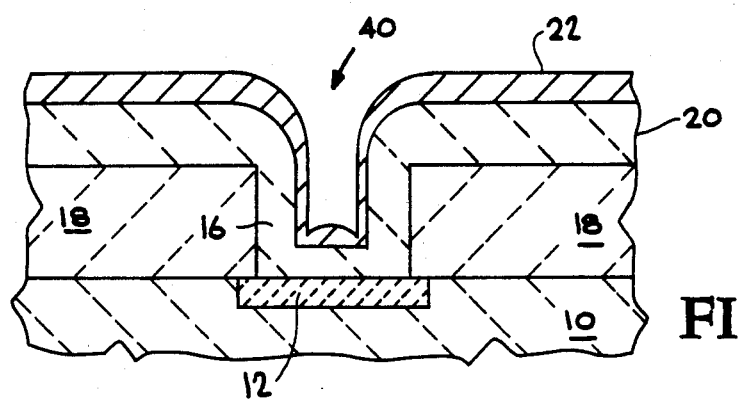
FIG. 6a shows step completion of a substrate having a contact via through a superposing layer onto which polysilicon and refractory metal layers have been sequentially deposited.
Figure 6B:
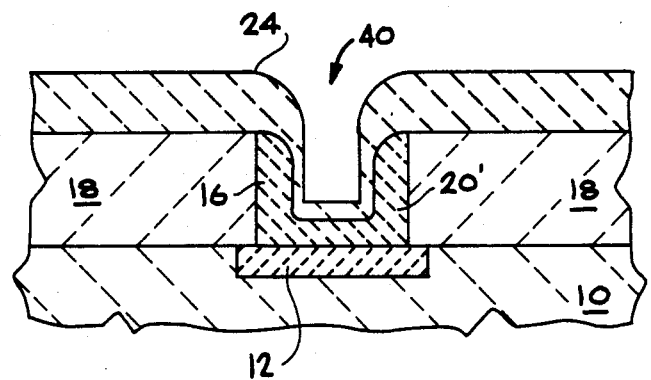
FIG. 6b shows step completion after the polysilicon and metal layers, as shown in FIG. 6a, have been reacted to form a polycide material.
Figure 6C:
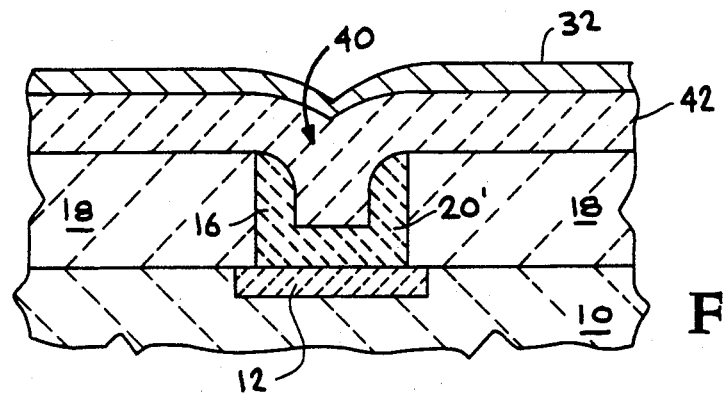
FIG. 6c shows step completion after the polycide layer, as shown in FIG. 6b, has been removed and a second polysilicon and second refractory metal layer have been sequentially formed.

A further alternative embodiment for very deep and very wide via structures, such as may be found in multilayer integrated circuits, is demonstrated in FIGS. 6a through 6f. In such a via 16, there is the danger of forming a void in the depression 40. The first steps of the process correspond to the embodiment demonstrated in FIGS. 4a and 4b, viz., there is an initial formation of a conformal polycide 24 having a depression 40 and a polysilicon 20' lining in the via 16, as shown in FIGS. 6a and 6b. The polycide 24 layer is then etched away. This results in a depression 40' which has a reduced aspect ratio and smoother contours compared to the original depression 40, as depicted in FIG. 6c.

A second layer of semiconductor material, e.g. polysilicon layer 42 and superposing second layer of refractory metal 32 are formed. Because of the modified depression 40', this deposition is more planar in nature.

Figure 6D:
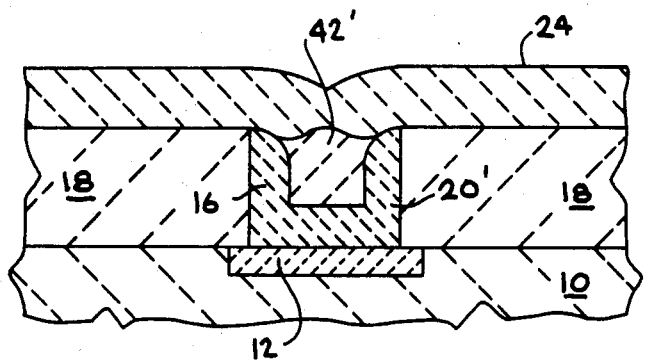
FIG. 6d shows step completion after the second polysilicon and second refractory metal layers, as shown in FIG. 6c, have been reacted to form a second polycide layer.

Next, a heat treatment cycle is performed to react the polysilicon 42 and refractory metal 32 to form a polycide 24' layer, leaving a polysilicon plug 42' in the structure as shown in FIG. 6d.

The second polycide 24' layer is then removed from the structure.

Figure 6E:
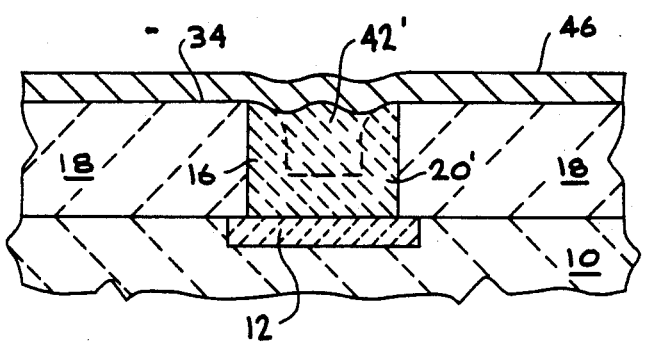
FIG. 6e shows step completion after the second polycide layer, as shown in FIG. 6d, has been removed and a third refractory metal layer has been deposited.
Figure 6F:
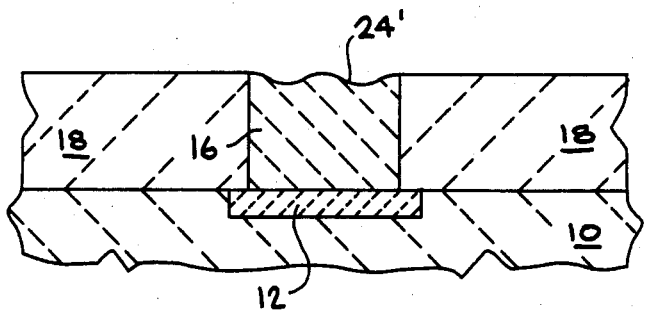
FIG. 6f shows step completion after the third refractory metal layer, as shown in FIG. 6e, has been reacted with the polysilicon in said contact via and any residual refractory metal has been removed.

Referring now to FIG. 6e, a third refractory metal 46 layer is formed on the structure. Because of the polysilicon plug 42', the surface 34 of the structure is now substantially planar and the thickness of the refractory metal 46 will be nearly uniform. As a result, the heat treatment cycle can be performed to form a polycide plug 24' in via 16, as shown in FIG. 6f.

This series of drawings also is intended to show that where, for example, the contact region 12 is relatively deep, the polysilicon residue layer 20' as shown in previous embodiments is not required because there is little chance of the polycide spiking through the junction despite variations in accordance wtih process tolerances. Hence, the plug 24' should have a lower overall resistance than one of the earlier described embodiments which retain the doped polysilicon layer 20'.

As will be obvious to one skilled in the art, contact vias 16 may open on both n-type and p-type surface areas of a substrate 10, especially in a complementary metal-oxidesemiconductor device. Appropriate conventional masking techniques can be used such that proper doping of the polysilicon 21 plugs to match adjacent contact regions 12 is accomplished.

The foregoing description of the preferred and alternative embodiments of the present invention has been presented for purposes of illustration and description. It is not intended to be exhaustive or to limit the invention to the precise form disclosed. Obviously, many modifications and variations will be apparent to practitioners skilled in this art. Similarly, any process steps described might be interchangeable with other steps in order to achieve the same result. The embodiments were chosen and described in order to best explain the principles of the invention and its practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. In the fabrication of a semiconductor integrated circuit, having a structure including contact vias through layer(s) superposing a substrate, a process for improving step coverage by yet-to-be-formed electrical coupling layers, comprising the steps of:
   (a) substantially filling said vias by forming a layer of silicon material on said structure;
   (b) forming a layer of refractory metal on said silicon material;
   (c) reacting said silicon material layer and said refractory metal layer such that at least some of said silicon material and at least some of said metal form a conductive silicide;
   (d) depositing a second layer of silicon material on said silicide layer such that unfilled via regions are substantially filled;
   (e) depositing a second layer of refractory metal on said structure;
   (f) heat treating said structure until substantially all unreacted silicon material is converted to a silicide; and
   (g) stripping said structure of said materials except from said vias, whereby subsequently formed layers provide substantially improved step coverage.

2. The process as set forth in claim 1, wherein said step (a) comprises:
   depositing a layer of doped polysilicon having a conductivity type which is the same as an area of said structure onto which said via opens.

3. A process for providing a contact plug in a contact via and providing improved planarity of the resulting structure, comprising the steps of:
   (a) substantially filling said contact via with silicon material;
   (b) forming a layer of refractory metal on said silicon material;
   (c) reacting said silicon material layer and said refractory metal layer such that at least some of said silicon material and at least some of said metal form a conductive silicide;
   (d) removing said silicide to expose unreacted silicon material;
   (e) forming a second layer of refractory metal on said structure; and
   (f) heat treating said structure until said second layer of refractory metal and said unreacted silicon material in said contact via form a silicide plug substantially filling said contact via.

4. A process for providing a contact plug in a contact via and providing improved planarity of the resulting structure, comprising the steps of:
   (a) substantially filling said contact via with silicon material;
   (b) forming a layer of refractory material on said silicon material;
   (c) heat treating said structure until said silicon material and said refractory metal form a silicide layer superposing said structure and partially filling said via such that a lining of said silicon material remains in said via;
   (d) removing said silicide layer;
   (e) depositing a second layer of silicon material on said structure;
   (e) depositing a second layer of refractory metal on said structure;
   (f) heat treating said structure until said second layer of silicon material and second layer of refractory metal form a silicide layer superposing said structure;
   (g) depositing a third layer of refractory metal on said structure; and
   (h) heat treating said structure until said silicon material remaining in said via and said third refractory metal form a silicide plug substantially filling said contact via.

5. A method for improving step coverage of electrical contact metallization in a semiconductor integrated circuit structure, having a relatively wide and relatively deep contact via, comprising the steps of:
   forming a first, conformal silicon material layer on said structure;

forming a first, conformal, refractory metal layer on said first silicon material layer;

thermally reacting said first silicon material layer and said first metal layer to form a first, conformal silicide layer at least partially filling said contact via of said structure;

forming a second amorphous silicon material layer, having a substantially planar upper surface, on said first silicide layer;

etching said second silicon material layer to form a substantially planar upper surface of said first silicide layer and said second silicon material layer in said contact via;

forming a second refractory metal layer on said subsequent planar surface;

thermally reacting said second metal layer, second silicon material layer, first silicide layer, and first silicon material layer to form a substantially homogeneous silicide layer; and removing said homogeneous silicide layer except from within said contact via, whereby a conductive plug, substantially fills said contact vias and substantially planarizes said structure.

6. The method as set forth in claim 5, wherein said step of forming said first silicon material further comprises introducing impurities into said silicon material to render it conductive.

7. A method for improving step coverage of electrical contact metallization in a semiconductor integrated circuit structure having a relatively wide and deep contact via, comprising the steps of:

forming a first, conformal silicon material layer on said structure;

forming a first, conformal, refractory metal layer on said first silicon material layer;

heating said structure such that said silicon material and said refractory metal form a first, conformal silicide layer;

removing said first silicide layer such that a silicon material lining remains in said contact via;

forming a second silicon material layer on said structure;

forming a second, refractory metal layer on said second silicon material layer;

heating said structure such that said second silicon material layer and said second, refractory metal layer form a second silicide layer except in said contact via;

removing said second silicide layer;

forming a third, refractory metal layer on said structure;

heating said structure such that said third metal layer and silicon material in said contact via form a silicide plug substantially filling said contact via.

8. The method as set forth in claim 7, wherein said step of forming said first, conformal, silicon material layer further comprises:

doping said material to render it conductive.

* * * * *